United States Patent

Muenz et al.

[11] Patent Number: 6,033,734
[45] Date of Patent: *Mar. 7, 2000

[54] METHOD OF COATING METALLIC AND CERAMIC SUBSTRATES

[75] Inventors: Wolf-Dieter Muenz; Iain James Smith; Lee Adrian Donohue; John Stuart Brooks, all of Sheffield, United Kingdom

[73] Assignee: Hauzer Industries B.V., Venlo, Netherlands

[*] Notice: This patent issued on a continued prosecution application filed under 37 CFR 1.53(d), and is subject to the twenty year patent term provisions of 35 U.S.C. 154(a)(2).

[21] Appl. No.: 08/767,889

[22] Filed: Dec. 17, 1996

[30] Foreign Application Priority Data

Dec. 18, 1995 [GB] United Kingdom ................. 19547305

[51] Int. Cl.⁷ ....................................... B05D 3/06
[52] U.S. Cl. ...................... 427/309; 427/580; 427/126.1; 204/192.38; 204/192.16; 204/298.41
[58] Field of Search .................................... 427/540, 580, 427/530, 126.1, 309; 204/192.38, 192.16, 298.41; 407/119

[56] References Cited

U.S. PATENT DOCUMENTS 5,306,407  4/1994  Hauzer .
5,549,975  8/1996  Schulz et al. ........................ 428/553

FOREIGN PATENT DOCUMENTS 0 558 061   9/1993   European Pat. Off. .
0 439 561   2/1994   European Pat. Off. .
2 344 642  10/1977   France .
WO 93/07306 4/1993   WIPO .

OTHER PUBLICATIONS

Pierson, "Handbook of Chemical Vapor Deposition (CVD) Principles, Technology and Applications", Noyes Publications (1992) p. 356.

*Primary Examiner*—Roy V. King
*Attorney, Agent, or Firm*—Townsend and Townsend and Crew LLP

[57] ABSTRACT

The invention is concerned with a reduction of the surface roughness of titanium-aluminum-nitride hard material layers produced by the combined cathodic arc discharge vaporization process and the imbalanced magnetron coating process (ABS method) or by the pure cathodic arc discharge vaporization process.

18 Claims, 5 Drawing Sheets

Ti (MP 1670°C)

Nb (MP 2450°C)

METHOD OF COATING METALLIC AND CERAMIC SUBSTRATES

FIELD OF THE INVENTION

The invention relates to a method of coating metallic and ceramic substrates such as cutting tools or forming tools and the like with TiAlN.

DESCRIPTION OF PRIOR ART

It is known that titanium aluminum nitride can be used as an alternative to high wear resistant TiN hard material layers. The improved oxidation resistance relative to TiN in particular makes this coating material a likely candidate for coolant-free chip-forming machining in automatic production lines, for example in the modern motorcar industry. In addition, titanium-aluminum-nitride hard material layers show an elevated resistance to abrasive wear in the presence of carbides, which comes to expression in a particularly advantageous manner in the machining of grey cast iron and cold working steels.

Titanium aluminum nitride is nowadays manufactured using all known PVD hard material coating processes, namely cathode sputtering, cathodic arc discharge vaporization, and the low voltage electron beam process.

Moreover, combination processes are known such as the combination of the cathodic arc discharge vaporization process as an etching source in the PVD process with the imbalanced magnetron as a coating tool, or the combination of either the cathodic arc discharge vaporization process with the low voltage electron beam vaporization process or with the magnetron during coating.

A process of this kind is known from European patent specification 0 439 561 for the coating of substrates which is also termed an ABS process in which the layer to be applied is manufactured by the incidence on the relevant substrate of condensing particles of the plasma produced by means of a gas discharge, with both an arc discharge vaporization process and also a cathode sputtering process being effected. It is important that the arc discharge vaporization process is only carried out during a first coating phase and the cathode sputtering process during a second coating phase following this first phase. The substrate is bombarded during the arc discharge vaporization process with ions, and the energy and ion current density are selected with this arrangement in such a way that the substrate surface is cleaned and partially removed by ion etching.

With this process the ion energy and the ion current density are preferably selected for the bombardment of the substrates with ions, which takes place during the arc discharge vaporization process so that an anchoring of the layer to be built up in the substrate material is brought about.

In the apparatus for carrying out this method there are provided, in a vacuum chamber filled with a process gas, a substrate holder which is electrically insulated relative to the vacuum chamber, a cathode which is occupied by the coating material and is likewise electrically insulated relative to the vacuum chamber, and an anode which is required for the arc discharge. The cathode is selectively connectable to an arc discharge supply or to a cathode sputtering supply and can be connected to negative potentials such that an arc discharge takes place in a first current circuit between the cathode and the anode or such that a cathode sputtering discharge takes place in a second circuit.

An apparatus for the coating of substrates using an arc discharge process and a cathode sputtering process is known from EP 0 459 137 Al which has an evacuatable container in which at least one target, an associated anode, and also a substrate carrier are arranged, with the associated current and voltage supplies being provided and with a magnet arrangement being associated with each target. The magnet arrangement, consisting of a center pole permanent magnet and oppositely poled permanent edge magnets surrounding and spaced from the latter, is displaceably mounted relative to the associated target in such a way that in the target area a magnetic field which enables cathode sputtering is generated in a first position adjacent to the target and a magnetic field which enables an arc discharge is generated in a second position spaced from the target.

OBJECT OF THE INVENTION

The present invention is concerned with PVD methods (physical vapor deposition methods) which preferably use either only the cathodic arc discharge vaporization process as a process source or use the latter in combination with cathode sputtering methods (magnetron, imbalanced magnetron).

DESCRIPTION OF THE INVENTION

Figure 1A:
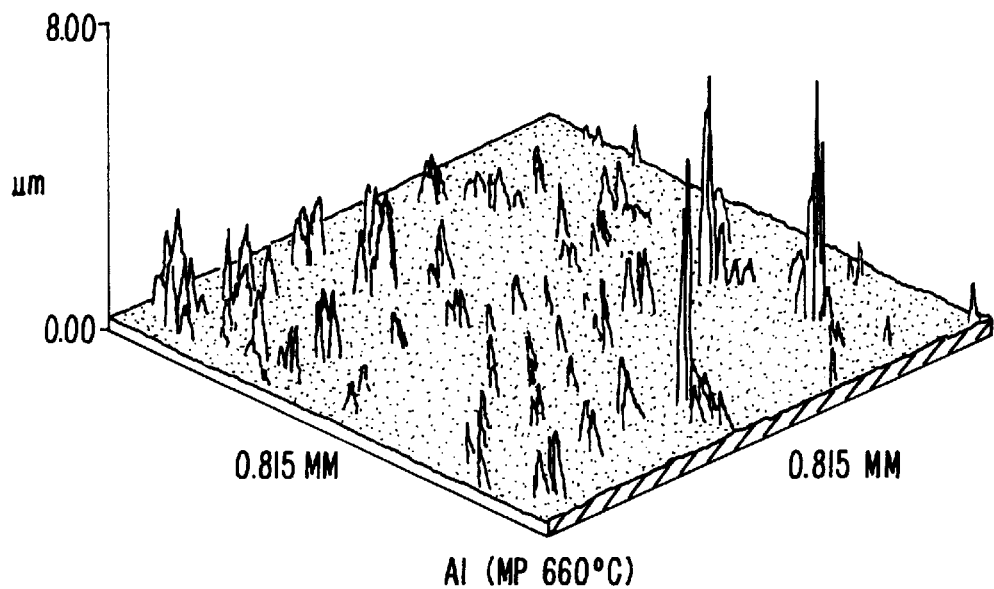
FIGS. 1a to 1g show a series of surface profiles.
Figure 1B:
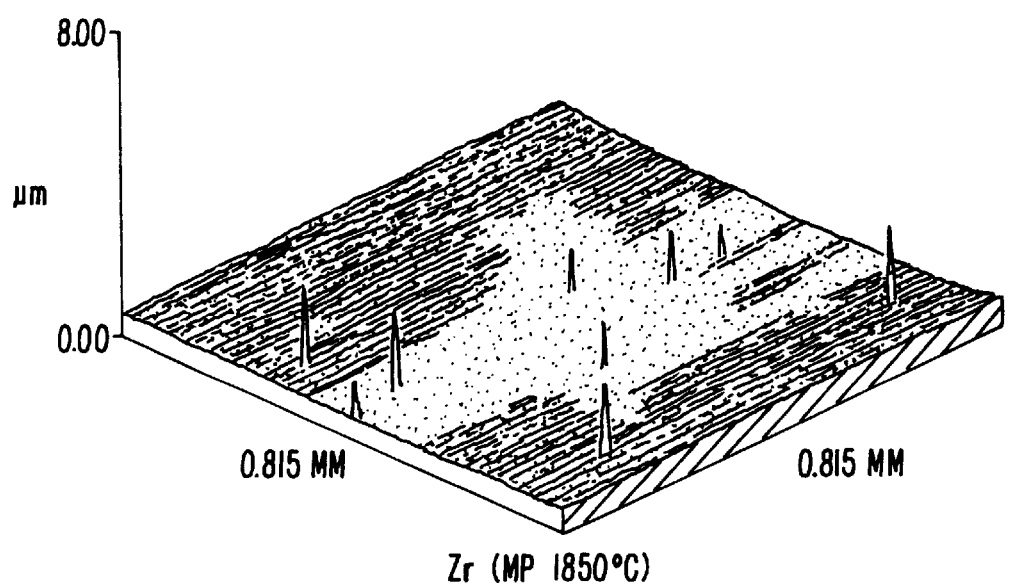
Figure 1C:
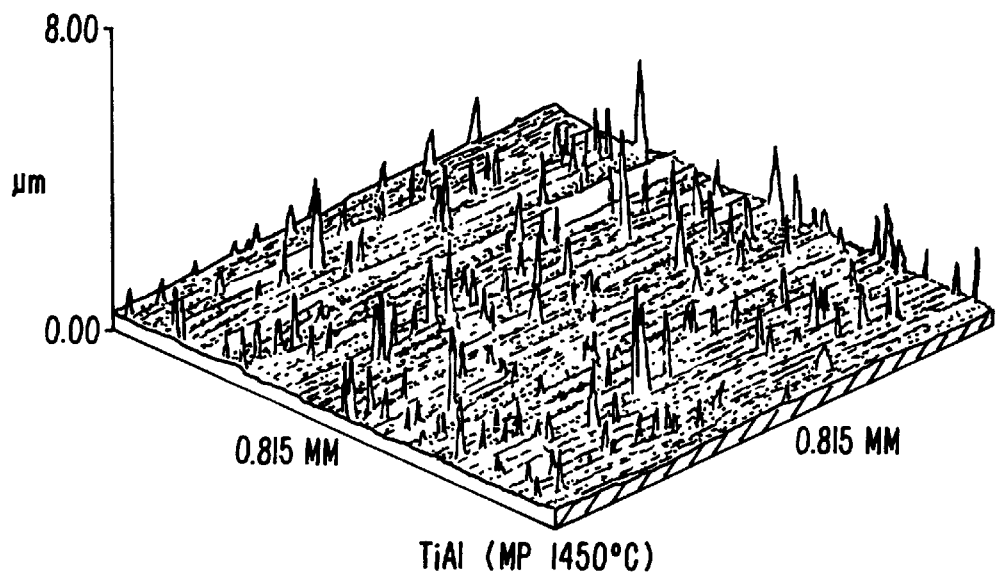
Figure 1D:
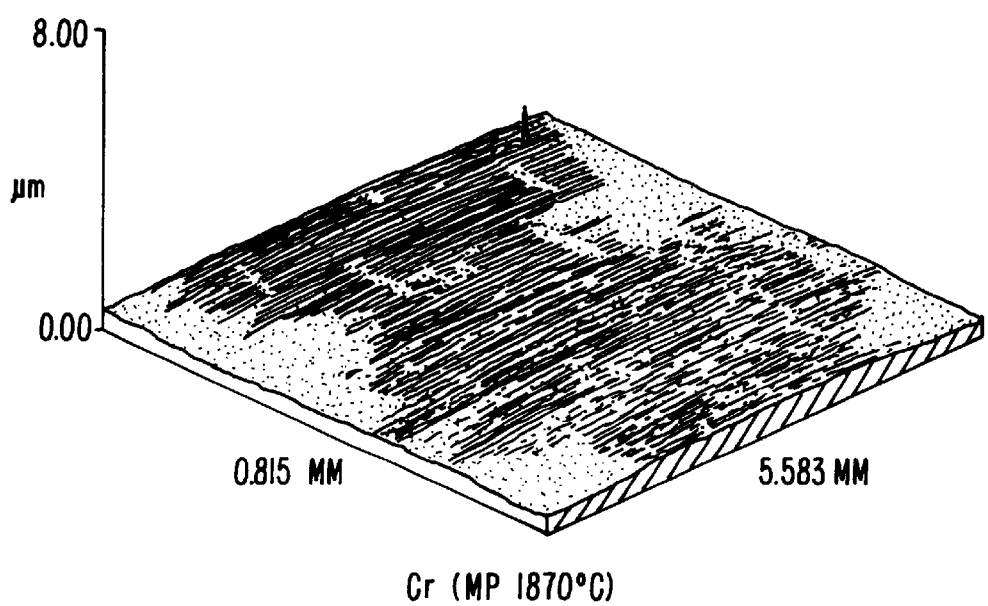
Figure 1E:
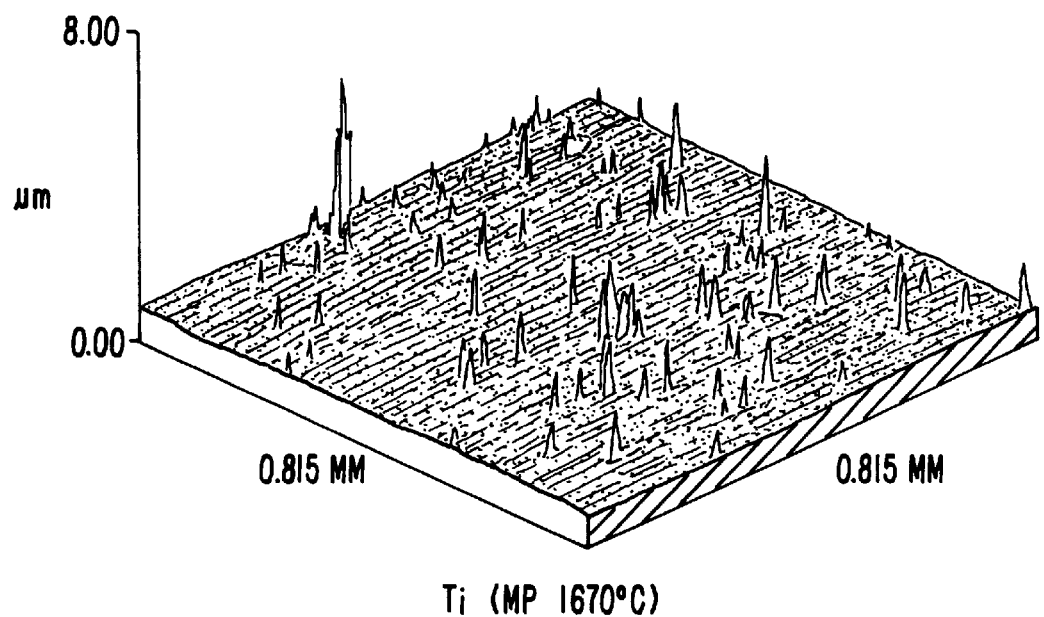
Figure 1F:
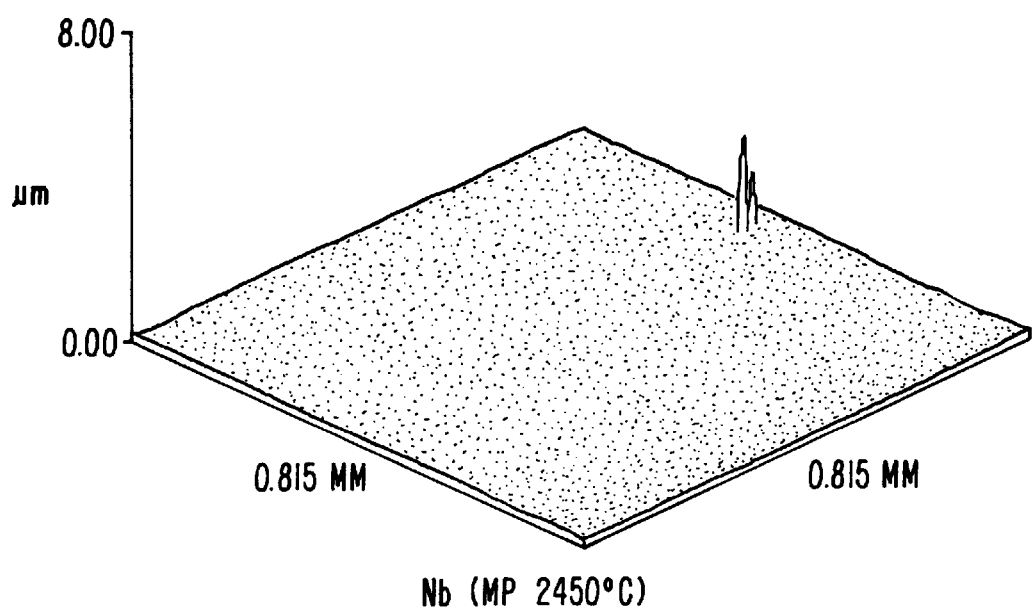
Figure 1G:
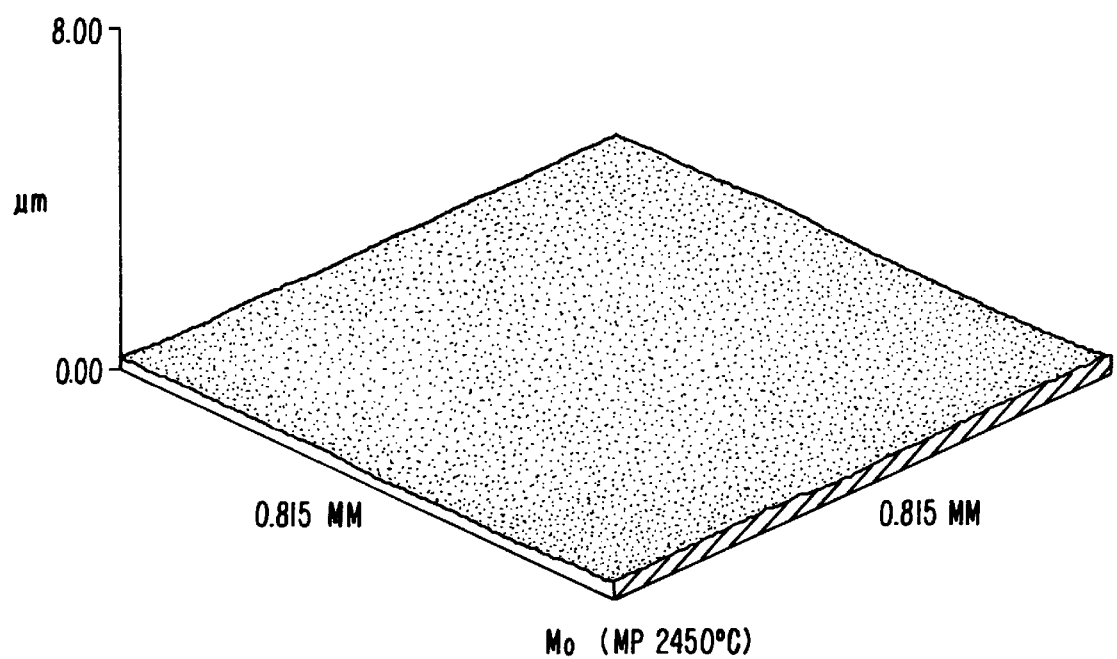

The starting point for the invention is the observation that during the metal ion etching process of the substrate, so-called "droplets" are deposited on the substrate surface which during subsequent coating prove to be the cause for local growth defects and which contribute to an enormous increase of the surface roughness of the titanium-aluminum-nitride layer.

This applies both for the case that the PVD coating is continued after the metal ion etching with a method which does not itself generate any "droplets", such as for example with an imbalanced magnetron, or also with a pure cathodic arc discharge vaporization process in which an additional "droplet" formation can be observed during the coating and thus a further increase of the surface roughness takes place.

As can be shown with respect to the behavior of TiAl and Ti as the target material in the cathodic arc discharge process, the number of "droplets" which arise during the metal ion etching is dependent on the melting temperature of the target. Higher melting temperatures lead to reduced "droplet" formation. Accordingly, the concentration of defects with a TiN coating (melting point of Ti:1670° C.) is substantially lower than with the TiAlN coating (melting point for 50:50 TiAl:1450° C.).

Two possibilities have been shown for reducing these effects. If one replaces the metal ion etching step using TiAl by an argon etching process, then the development of growth defects is almost completely suppressed.

However, it has also been shown that the bond strength of TiAlN layers is greatly impaired if one replaces the metal ion etching step by an etching step with inert argon ions.

In order to understand the influence of the target material during the cathodic arc discharge vaporization process with respect to the creation of "droplets" and to the bondability of TiAlN layers, the metals Al, TiAl, Ti, Zr, Cr, Nb, Mo were investigated as a metal ion etching vapor. During these etching experiments, the substrate material of steel was placed as a negative bias of −1200 volts. During the cathodic arc discharge process an argon pressure of $10^{-3}$ mbar prevailed. The distance between the test substrate and the arc discharge source amounted to ca. 40 cm on average.

With an increasing melting temperature the diameter of the "droplets" reduced from a maximum of 15 µm for Al to approximately a maximum of 1.5 µm for Nb.

Parallel to this the "droplet" concentration of $8\times10^4$ "droplets" per $cm^2$ for Al reduced to $1\times10^4$ "droplets" per $cm^2$ for Nb.

The roughness of the steel substrate following the etching also reduced substantially from $R_a$=0.044 µm for Al to Ra=0.005 µ for Nb.

The named metals cover a melting point range from ca. 660° C. for Al to 2470° C. for Nb.

All materials of TiAl (1450° C.), Ti (1670° C.), Zr (1850° C.) to Cr (1870° C.) follow this tendency with respect to an inclination to "droplet" formation.

A particularly low level of the "droplet" formation is only achievable in the case of chromium and molybdenum.

Although Cr has a melting point close to that of zirconium, the surface roughness already had the same low value as for the metal niobium as a cathodic arc discharge source, namely $R_a$=0.005 µm. The high vapor pressure of the chromium even far below the melting point can be regarded as the explanation. Even following the solidification, the diameter of the "droplets" at the substrate evidently reduces in a notable manner.

As an explanation for this circumstance, FIGS. 1a to 1g show a series of surface profiles.

The peak height is proportional to the diameter of the "droplet" and corresponds for all materials, apart from Al, to a maximum of 4 µm. In this respect it should be noted that this is a factor 2 smaller than for aluminum. Here the maximum value is approximately 8 µm.

Parallel to this it was found that the bond strength of TiAlN layers deposited with the imbalanced magnetron on high speed steel HSS with TiAl, Cr or Ti in the metal ion etching process is comparably high in practice, namely critical load 50–70 N, whereas for Zr and Nb this characteristic value sank to 20–40 N.

If one compares the roughness of 3 to 4 µm thick TiAlN layers on high speed steel HSS etched with Cr ions with layers of this kind which were etched with TiAl, then one finds a value of $R_a$=0.05 µm for the Cr etched samples and a value of $R_a$=0.15 µm for the TiAl etched samples.

On the basis of these positive results spiral drills with a diameter of 8 mm which have been coated with TiAlN to ca. 3 µm thickness using the ABS process were investigated on flat polished test surfaces. The ABS method is a combined process of metal ion etching in a cathodic arc discharge and of coating using the imbalanced magnetron.

| The following cutting parameters were used: | |
| --- | --- |
| Material | GG25 (grey cast iron) |
| cutting speed | 60 m/min |
| feed | 0.3 mm/rpm |
| depth (blind bore) | 28 mm |
| lubricant | dry |
| The following cutting results were obtained: | |
| uncoated | 20 holes |
| coated*/TiAl etching step | 100 holes |
| coated*/Cr etching step | 220 holes. |

The composition of the layer amounted to 42 atomic % Ti and 58 atomic % Al at 100 atomic % N.

All experiments were carried out in a four-target coating plant of the type HTC-1000/4 ABS.

Figure 2:
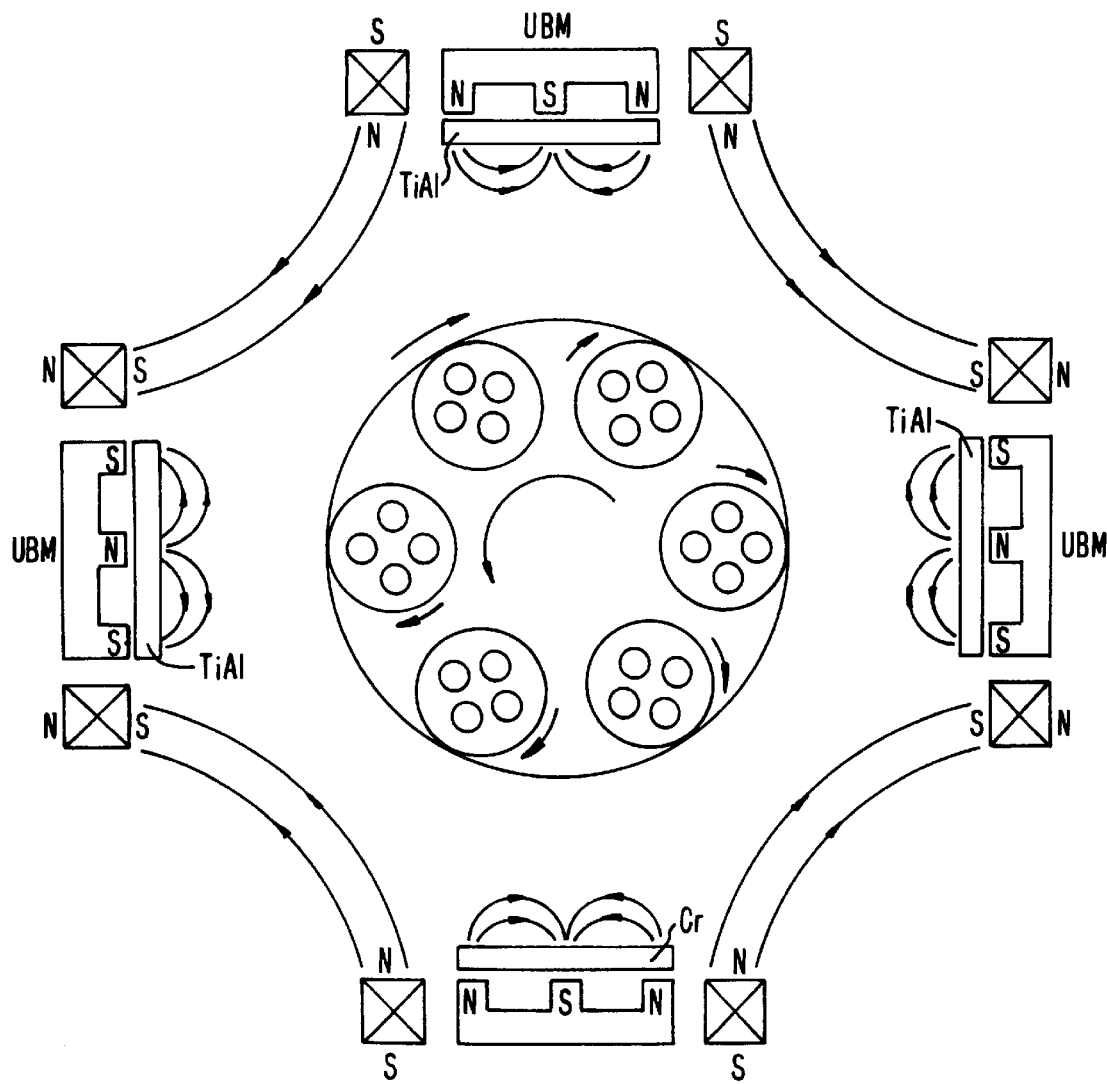
FIG. 2 shows a schematic cross-section through a plant HTV-1000/4 ABS operating in accordance with the ABS method.

FIG. 2 shows a schematic cross-section through a plant HTV1000/4 ABS operating in accordance with the ABS method. Four vertically arranged cathodes (target surface: 600×200 $mm^2$) can be used either in accordance with the cathodic arc discharge vaporization principle or as an imbalanced magnetron.

All four cathodes can be magnetically coupled together with the aid of electromagnets (concentric coils), so that a magnetically closed space arises in which the substrate carriers are located which rotate and are additionally arranged on a rotary plate. The transition from the cathodic arc discharge to the imbalanced magnetron can be adjusted via the position of the permanent magnets relative to the target surface. During the experiments that were carried out, three cathodes were occupied with TiAl (50:50) targets and one cathode with a Cr target.

It was possible to further improve the cited cutting results when the Cr target used in a four-target PVD plant for the etching step was also used during the TiAlN coating. In this case, the drilling result could be increased to 380 holes. Similar positive values, namely 420 holes, were obtained when one added carbon-containing gases such as $CH_4$ or $C_2H_2$ etc. to the process gases Ar and N when using the Cr target during the TiAlN coating with the imbalanced magnetron. In this respect the carbon-containing gas was only added to the already present gas mixture during the last phase of the coating, for example after the expiration of 75% of the total coating time.

Finally, comparative drilling tests were also carried out with drills which had been coated with ABS or in a purely cathodic arc discharge deposition technique.

Here the following result was shown:

ABS with TiAl in the metal ion etching stage and pure cathodic arc discharge vaporization coating showed similar results in the above-described test, that is to say the drilling result lay at ca. 100 holes.

As a result, proof has been submitted that, with regard to the dry cutting, the greatest care must be developed with respect to the layer roughness. Rough layers are clearly exposed to an increased frictional resistance. As a result elevated cutting temperatures arise which in turn lead to shortened lifetimes. The results presented show clearly that the phenomenon of "droplet" formation can be decisively influenced on the basis of a suitable choice of material.

In the following scheme the process sequence for the ABS coating with Cr or TiAl as metal ion etching variants is illustrated.

Both methods lead to very different results with regard to the roughness of the surface layers. Cr etched substrates are substantially smoother than TiAl etched substrates.

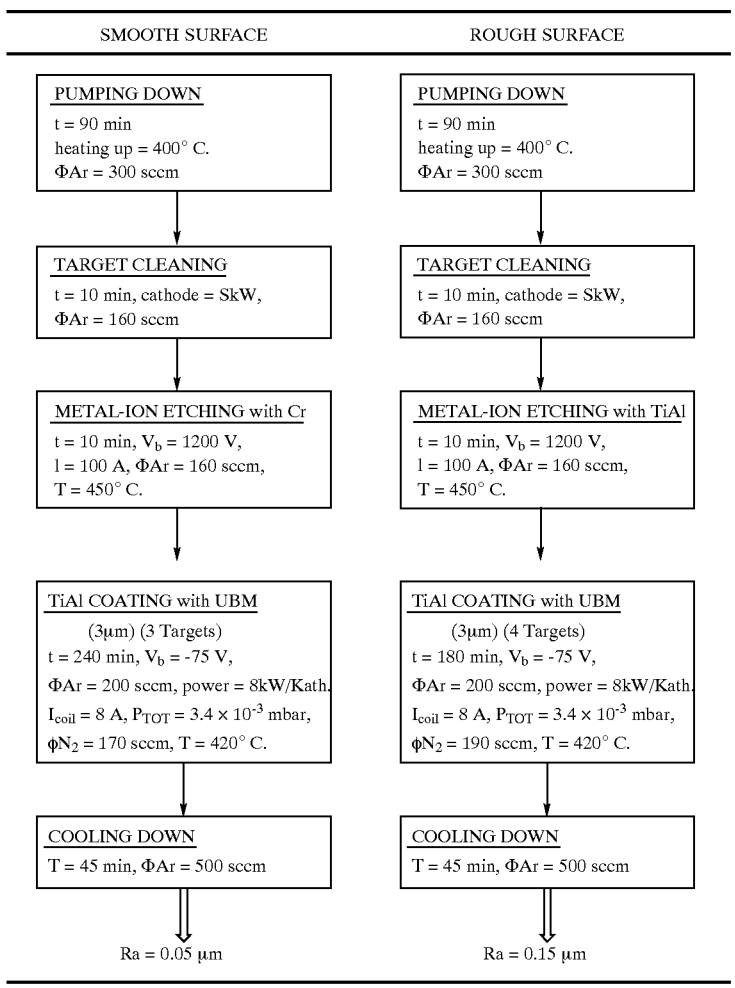

What is claimed is:

1. A method of coating metallic substrates with a TiAlN layer using PVD-coating methods comprising etch-treating a metallic substrate surface with at least one of Cr- and Mo ions prior to coating.

2. A method of claim 1 wherein the PVD-coating method uses the imbalanced magnetron process.

3. A method of claim 1 wherein the PVD-coating method uses the cathodic arc discharge vaporization process.

4. A method of claim 1 wherein the Cr- and Mo ions originate from a cathodic arc discharge vaporization process.

5. A method of claim 1 wherein during the etch-treatment step, the substrate lies at a negative bias voltage in a range of 800 to 1200 volts.

6. A method in accordance with claim 5 wherein the negative bias voltage is equal to 1200 volts.

7. A method in accordance with claim 1 wherein the metallic substrate consists of one of high speed steel, cold working steel, hot working steel, and tungsten carbide.

8. A method in accordance with claim 1 wherein the TiAlN layer has a metal content in the range of 40 to 85 atomic % titanium and 15 to 60 atomic % aluminum, respectively.

9. A method in accordance with claim 8 wherein the titanium content is approximately 42 atomic % and the aluminum content is approximately 58 atomic %.

10. A method in accordance with claim 1 wherein during the coating of the metallic substrate with the TiAlN layer, Cr or CrN is additionally and simultaneously deposited.

11. A method in accordance with claim 10 wherein the deposition of Cr or CrN is performed using the imbalanced magnetron method.

12. A method in accordance with claim 10 wherein the deposition of Cr or CrN is performed with the cathodic arc discharge vaporization method.

13. A method in accordance with claim 10 wherein the proportion of Cr in the total metal content of the TiAlCrN layer is in a range between 5 and 60 atomic %.

14. A method in accordance with claim 13 wherein the proportion of Cr in the total metal content amounts to 20 atomic %, the proportion of Ti amounts to 34 atomic %, and the proportion of Al amounts to 46 atomic %.

15. A method in accordance with claim 10 wherein a portion of a layer adjoining the metallic substrate consists of pure TiAlN and only a subsequent portion of the layer consists of TaAlCrN.

16. A method in accordance with claim 15 wherein the portion of the layer adjoining the substrate that consists of pure TiAlN is in a range of 1 to 30% of the total layer thickness.

17. A method in accordance with claim 1 wherein at least 75% of the process of coating with TiAl takes place reactively in a gas atmosphere consisting of Ar and $N_2$, and wherein a remainder of the coating takes place in a mixture of Ar and $N_2$ or a mixture of a hydrocarbon gas.

18. A method in accordance with claim 1 wherein a layer of $MOS_2$ having a thickness in a range of 0.05 to 1 micrometer is deposited onto a surface of the TiAlN layer.

* * * * *